US012625168B2

(12) United States Patent
Shindo

(10) Patent No.: US 12,625,168 B2
(45) Date of Patent: May 12, 2026

(54) CURRENT MEASUREMENT DEVICE AND CURRENT MEASUREMENT METHOD

(71) Applicant: HONDA MOTOR CO., LTD., Tokyo (JP)

(72) Inventor: Yusuke Shindo, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 142 days.

(21) Appl. No.: 18/585,081

(22) Filed: Feb. 23, 2024

(65) Prior Publication Data

US 2024/0329094 A1 Oct. 3, 2024

(30) Foreign Application Priority Data

Mar. 31, 2023 (JP) ................................. 2023-058223

(51) Int. Cl.
  *G01R 15/18* (2006.01)
(52) U.S. Cl.
  CPC .................................. *G01R 15/185* (2013.01)
(58) Field of Classification Search
  CPC ...... G01R 15/185; G01R 15/00; G01R 19/00; G01R 1/30
  See application file for complete search history.

(56) References Cited

U.S. PATENT DOCUMENTS

| | | | | | |
|---|---|---|---|---|---|
| 5,508,606 | A | * | 4/1996 | Ryczek | G01R 15/185 |
| | | | | | 361/45 |
| 5,537,038 | A | * | 7/1996 | Ando | G01R 33/04 |
| | | | | | 324/237 |

| | | | | | |
|---|---|---|---|---|---|
| 6,381,113 | B1 | * | 4/2002 | Legatti | H02H 3/335 |
| | | | | | 361/93.6 |
| 9,829,512 | B2 | * | 11/2017 | Barczyk | G01R 19/0092 |
| 2011/0006753 | A1 | * | 1/2011 | Yu | G01R 15/185 |
| | | | | | 324/117 R |
| 2013/0300428 | A1 | * | 11/2013 | Bettenwort | G01R 31/52 |
| | | | | | 324/509 |
| 2014/0312892 | A1 | * | 10/2014 | Lenhard | G01R 15/185 |
| | | | | | 324/244 |
| 2016/0003873 | A1 | * | 1/2016 | Boudreau, Jr. | G01R 15/18 |
| | | | | | 324/127 |
| 2020/0096541 | A1 | * | 3/2020 | Levy | G01R 19/0092 |
| 2022/0244297 | A1 | * | 8/2022 | Hutchinson | G01R 35/00 |

FOREIGN PATENT DOCUMENTS

JP H0581730 U 11/1993

* cited by examiner

*Primary Examiner* — Christopher P McAndrew
(74) *Attorney, Agent, or Firm* — CKC & Partners Co., LLC

(57) ABSTRACT

An object is to separately measure the DC and AC components included in a measurement target current. The current measurement device includes a core, a coil, an element, an AC measurement circuit, a low-pass filter, a current adjustment circuit, and a DC measurement circuit. The core allows magnetic flux to flow therethrough due to the measurement target current. The element generates a feedback voltage, based on the magnetic flux flowing along the core. The AC measurement circuit measures the AC component of the measurement target current, based on the feedback voltage. The current adjustment circuit allows a feedback current to flow through the coil, counteracting the DC component of the core magnetic flux, based on the feedback voltage from which the AC component has been removed by the low-pass filter. The DC measurement circuit measures the DC component of the measurement target current, based on the feedback current.

5 Claims, 6 Drawing Sheets

<COMPARATIVE EMBODIMENT>

FIG. 4

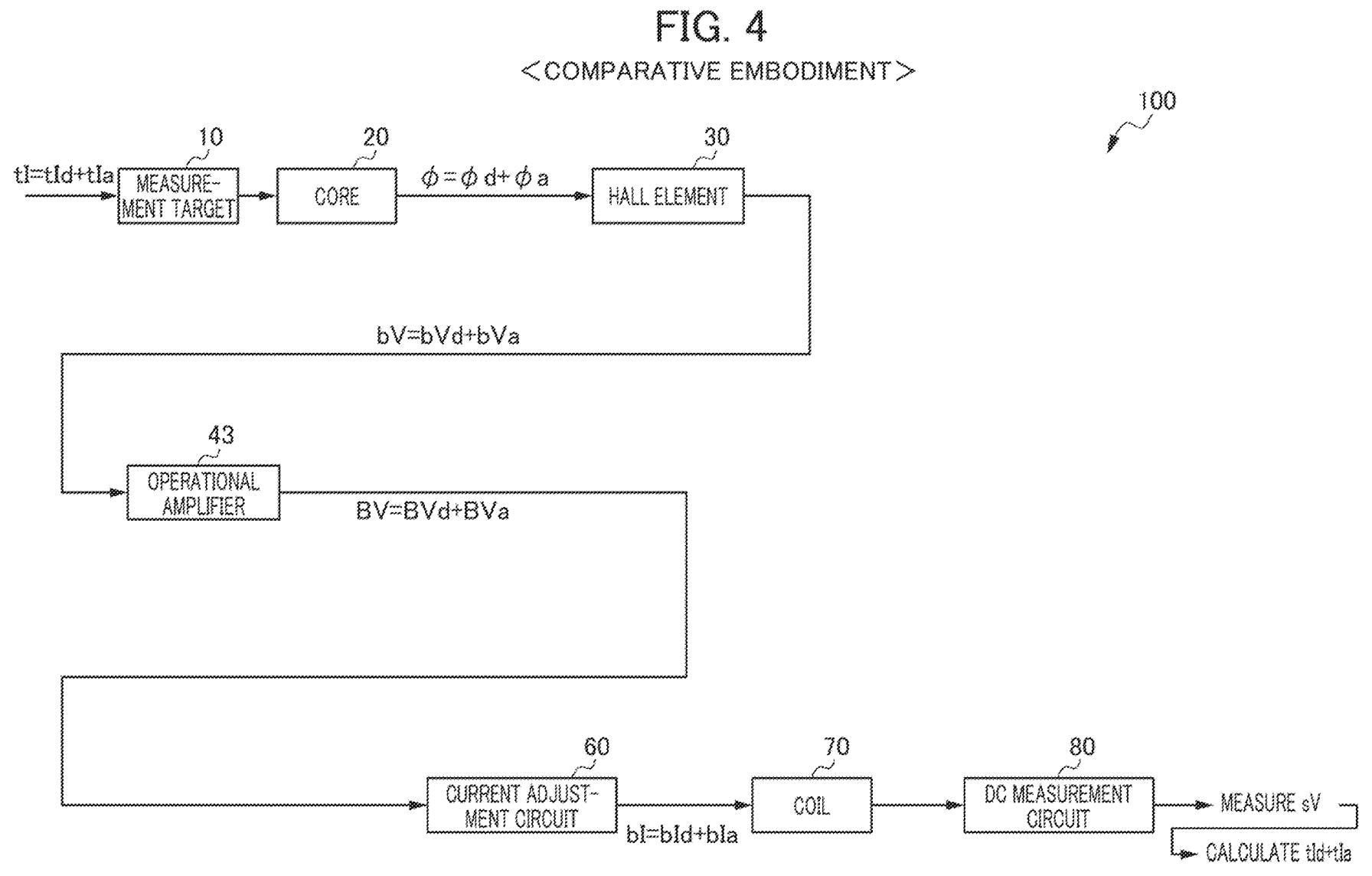

<COMPARATIVE EMBODIMENT>

100

$tI=tId+tIa$

| 10 |
|---|
| MEASURE-MENT TARGET |

$\phi = \phi d + \phi a$

| 20 |
|---|
| CORE |

| 30 |
|---|
| HALL ELEMENT |

$bV=bVd+bVa$

| 43 |
|---|
| OPERATIONAL AMPLIFIER |

$BV=BVd+BVa$

| 60 |
|---|
| CURRENT ADJUST-MENT CIRCUIT |

$bI=bId+bIa$

| 70 |
|---|
| COIL |

| 80 |
|---|
| DC MEASUREMENT CIRCUIT |

MEASURE sV

CALCULATE tId+tIa

CURRENT MEASUREMENT DEVICE AND CURRENT MEASUREMENT METHOD

This application is based on and claims the benefit of priority from Japanese Patent Application No. 2023-058223, filed on 31 Mar. 2023, the content of which is incorporated herein by reference.

BACKGROUND OF THE INVENTION

Field of the Invention

The present invention relates to a current measurement device that measures a measurement target current flowing through a measurement target.

Related Art

Some current measurement devices include a core, a Hall element, a current adjustment circuit, a coil, and a current measurement circuit. The core allows magnetic flux to flow therethrough due to the measurement target current. The coil is externally fitted around the core. The Hall element generates a feedback voltage, based on the core magnetic flux, which is the magnetic flux flowing along the core. The current adjustment circuit allows a feedback current to flow through the coil, counteracting the core magnetic flux, based on the feedback voltage. The current measurement circuit measures the measurement target current, based on the feedback current.

Patent Document 1: Japanese Utility Model Unexamined Application, Publication No. Hei 5-81730

SUMMARY OF THE INVENTION

With such a current measurement device, the core magnetic flux can be counteracted with the feedback current. Therefore, even when the core cross-sectional area is smaller compared to those used in magnetic-proportional current measurement devices, the core magnetic flux can be sufficiently suppressed, thus the heat generation inside the core and the magnetic saturation can be sufficiently suppressed.

However, the inventors have identified potential problems as follows. Namely, when generating a feedback current based on the feedback voltage, a response delay occurs in the current adjustment circuit. Consequently, when the frequency of the AC component included in the measurement target current is high, a significant phase delay occurs in the AC component of the feedback current relative to the AC component of the measurement target current. This characteristic may lead to adverse effects. Specifically, in the most extreme case, if this phase delay becomes half the wavelength of the AC component of the measurement target current, it could amplify, rather than counteract, the AC component of the core magnetic flux with the AC component of the feedback current.

Moreover, when the measurement target current includes both DC and AC components, the feedback current also includes DC and AC components. Therefore, such current measurement circuits for measuring the measurement target current, based on the feedback current, cannot separately measure the DC and AC components included in the measurement target current.

The present invention has been made in view of the above circumstances with objects to suppress the adverse effects due to the phase delay in the AC component of the feedback current relative to the AC component of the measurement target current, as well as to separately measure the DC and AC components included in the measurement target current.

The inventors have made the present invention by finding that the objects can be achieved by measuring the AC component of the measurement target current, based on the feedback voltage, then removing the AC component from the feedback voltage, and measuring the DC component of the measurement target current, based on the feedback current. The present invention is the current measurement device described below in (1) to (3) and the current measurement method described below in (4).

(1) A current measurement device that measures a measurement target current that is a current flowing through a measurement target, in which the device includes:

a core through which magnetic flux flows due to the measurement target current;

a coil externally fitted around the core;

an element that generates a feedback voltage, based on core magnetic flux that is a magnetic flux flowing along the core;

an AC measurement circuit that measures an AC component of the measurement target current, based on the feedback voltage;

a low-pass filter that removes an AC component equal to or above a predetermined frequency from the feedback voltage, a current adjustment circuit that allows a feedback current to flow through the coil, based on the feedback voltage from which the AC component has been removed, to counteract a DC component of the core magnetic flux; and a DC measurement circuit that measures a DC component of the measurement target current, based on the feedback current.

With this configuration, the low-pass filter removes the AC component from the feedback voltage. The current adjustment circuit allows the feedback current to flow through the coil, based on the feedback voltage from which the AC component has been removed. Therefore, the feedback current does not include any AC component for counteracting the AC component of the core magnetic flux. Thus, a phase delay in the AC component of the feedback current relative to the AC component of the measurement target current does not occur. As a result, the adverse effects caused by such phase delays can be suppressed.

Moreover, since the feedback current does not include an AC component, the AC component of the core magnetic flux remains uncounteracted. The AC measurement circuit can measure the AC component of the measurement target current, based on the feedback voltage based on the core magnetic flux. On the other hand, the DC measurement circuit can measure the DC component of the measurement target current, based on the feedback current, which is based on the feedback voltage from which the AC component has been removed by the low-pass filter. Hence, it is possible to separately measure the DC and AC components included in the measurement target current.

As described above, with this configuration, it is possible to suppress the adverse effects due to the phase delay in the AC component of the feedback current relative to the AC component of the measurement target current, as well as to separately measure the DC and AC components included in the measurement target current.

(2) The current measurement device as described above in (1), in which the AC measurement circuit includes an operational amplifier that amplifies the feedback voltage generated by the element, and the AC measurement circuit measures an AC component of the measurement target current, based on the feedback voltage amplified.

With this configuration, an operational amplifier can be used to implement the AC measurement circuit.

(3) The current measurement device as described above in (1) or (2), which further includes a preliminary low-pass filter that removes an AC component equal to or above a preliminary frequency that is higher than the predetermined frequency from the feedback voltage, before the low-pass filter removes an AC component equal to or above the predetermined frequency from the feedback voltage, and the AC measurement circuit measures an AC component of the measurement target current, based on the feedback voltage from which the AC component equal to or above the preliminary frequency has been removed.

This configuration allows for narrowing down the measurement range of the AC component included in the measurement target current to a range equal to or below the preliminary frequency and equal to or above the predetermined frequency.

(4) A current measurement method of measuring a measurement target current by using: a core through which magnetic flux flows due to the measurement target current that is a current flowing through a measurement target;

a coil externally fitted around the core; and an element that generates a feedback voltage, based on core magnetic flux that is a magnetic flux flowing along the core; in which the method includes the steps of:

measuring an AC component of the measurement target current, based on the feedback voltage;

removing an AC component equal to or above a predetermined frequency from the feedback voltage using a low-pass filter;

allowing a feedback current to flow through the coil, based on the feedback voltage from which the AC component has been removed, to counteract a DC component of the core magnetic flux; and measuring a DC component of the measurement target current, based on the feedback current.

The method according to this configuration achieves the same effects as the device described in (1) does.

As described above, the device of (1) and the method of (4) allow for suppressing the adverse effects due to the phase delay in the AC component of the feedback current relative to the AC component of the measurement target current, and enable the separate measurement of the DC and AC components included in the measurement target current. Furthermore, the configurations of (2) and (3) that cite (1) provide additional effects respectively.

BRIEF DESCRIPTION OF THE DRAWINGS

FIG. 1 is a circuit diagram illustrating a current measurement device of a first embodiment;

FIG. 3 is a circuit diagram illustrating a current measurement device of a comparative embodiment;

FIG. 4 is a configuration diagram illustrating the current measurement device;

DETAILED DESCRIPTION OF THE INVENTION

Figure 2:
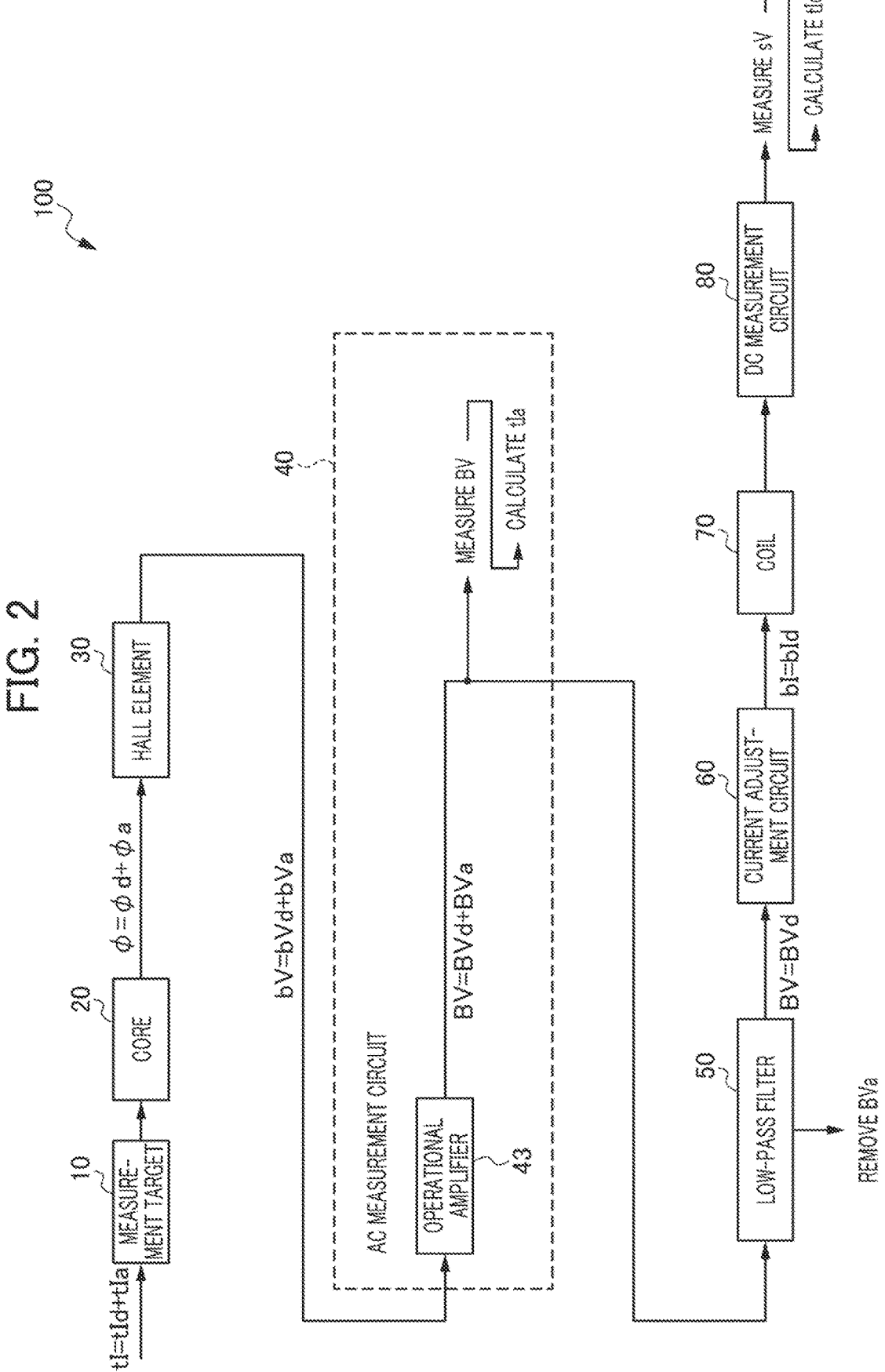
FIG. 2 is a configuration diagram illustrating the current measurement device.

Hereinafter, embodiments of the present invention will be described with reference to the drawings. However, the present invention is not limited to these embodiments and can be modified and implemented within the spirit and scope of the present invention.

First Embodiment

Figure 1:
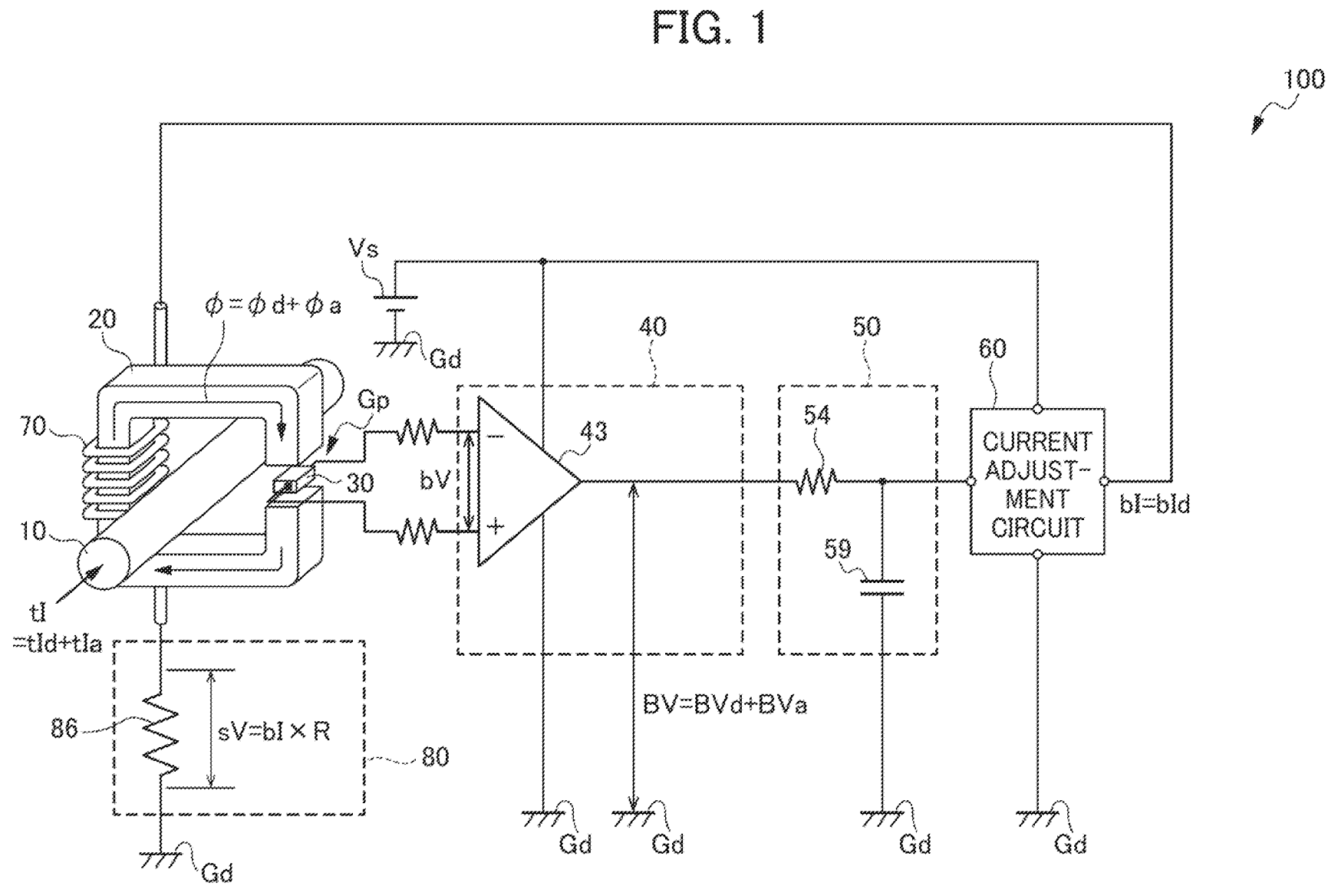

A current measurement device 100 of the present embodiment as illustrated in FIG. 1 is set up for a measurement target 10 that is part of a predetermined circuit. Hereinafter, the current flowing through the measurement target 10 is referred to as "measurement target current tI". The measurement target current tI includes, for example, a DC component tId as a main component, and an AC component tIa as noise or the like.

The current measurement device 100 includes a core 20, a Hall element 30, an AC measurement circuit 40, a low-pass filter 50, a current adjustment circuit 60, a coil 70, and a DC measurement circuit 80.

The core 20, made of a magnetic material such as metal, extends in the circumferential direction of the measurement target 10 so as to surround the measurement target 10. A gap Gp is provided in part of the circumferential direction of the core 20. Hereinafter, the magnetic flux flowing along the core 20 is referred to as "core magnetic flux $\varphi$". Inside the core 20, the core magnetic flux $\varphi$ is generated by the measurement target current tI. More specifically, the DC component tId of the measurement target current tI generates a DC component $\varphi d$ of the core magnetic flux, and the AC component tIa of the measurement target current tI generates an AC component $\varphi a$ of the core magnetic flux.

The coil 70 is externally fitted around the core 20. Hereinafter, a state where the DC component tId of the measurement target current remains constant is referred to as the "steady state". The measurement target current tI is in the steady state at most times. More specifically, the steady state is maintained except for specific timings such as startup, output change, or shutdown of the circuit to which the measurement target 10 belongs. In this steady state, the DC component $\varphi d$ of the core magnetic flux is reduced to zero by the magnetic flux due to the feedback current bI flowing through coil 70. Therefore, in the steady state, the core magnetic flux $\varphi$ consists only of the AC component $\varphi a$.

The Hall element 30, located at the gap Gp, is a voltage-generating element. Namely, the Hall element 30 generates a feedback voltage bV, based on the core magnetic flux $\varphi$ passing through the gap Gp. Specifically, as illustrated in FIG. 2, the Hall element 30 generates a DC component bVd of the feedback voltage, based on the DC component $\varphi d$ of the core magnetic flux, and an AC component bVa of the feedback voltage, based on the AC component $\varphi a$ of the core magnetic flux. However, as mentioned earlier, since the core magnetic flux $\varphi$ consists only of the AC component $\varphi a$ in the steady state, the feedback voltage also consists only of the AC component bVa in the steady state.

As illustrated in FIG. 1, the AC measurement circuit 40 includes an operational amplifier 43. The non-inverting input terminal of the operational amplifier 43 is electrically connected to one end of the Hall element 30, and the inverting input terminal is electrically connected to the other end of the Hall element 30. Furthermore, the positive power supply terminal of the operational amplifier 43 is electrically connected to the positive terminal of a constant voltage source Vs, and the negative power supply terminal of the operational amplifier 43 is electrically connected to the ground side wiring Gd. Consequently, the operational amplifier 43 amplifies the feedback voltage bV from the Hall element 30 and outputs it from the output terminal. Hereinafter, the feedback voltage bV amplified by the operational amplifier 43 is referred to as "amplified feedback voltage BV". The amplified feedback voltage BV, like the feedback voltage bV, includes a DC component BVd and an AC component BVa, but consists only of the AC component BVa in the steady state.

As illustrated in FIG. 2, the AC measurement circuit 40 in the steady state can calculate the AC component φa of the core magnetic flux, based on the amplified feedback voltage BV=BVa consisting only of the AC component BVa, and subsequently calculate the AC component tIa of the measurement target current. Therefore, the AC measurement circuit 40 measures the AC component tIa of the measurement target current, based on the feedback voltage bV from the Hall element 30.

As illustrated in FIG. 1, the output terminal of the operational amplifier 43 is electrically connected to the input terminal of the current adjustment circuit 60 via the low-pass filter 50. Specifically, the low-pass filter 50 includes an electrical resistor 54 and a capacitor 59. The output terminal of the operational amplifier 43 is electrically connected to one end of the electrical resistor 54. The other end of the resistor 54 is electrically connected to the input terminal of the current adjustment circuit 60 and also electrically connected to the ground side wiring Gd through the capacitor 59.

Therefore, the low-pass filter 50 removes an AC component equal to or above a predetermined frequency, determined by the resistance value of the resistor 54 and the capacitance of the capacitor 59. This predetermined frequency is lower than the frequency of the AC component tIa assumed to be included in the measurement target current tI. As such, as illustrated in FIG. 2, the low-pass filter 50 removes almost the entire AC component BVa from the amplified feedback voltage BV=BVd+BVa outputted by the operational amplifier 43. Thus, the amplified feedback voltage BV essentially consists only of the DC component BVd. This DC component BVd, as previously mentioned, is zero in the steady state. Consequently, the amplified feedback voltage BV=BVd inputted into the current adjustment circuit 60 is zero in the steady state.

As illustrated in FIG. 1, the positive power supply terminal of the current adjustment circuit 60 is electrically connected to the positive terminal of the constant voltage source Vs, and the negative power supply terminal of the current adjustment circuit 60 is electrically connected to the ground side wiring Gd. The output terminal of the current adjustment circuit 60 is electrically connected to one end of the coil 70. Thus, as illustrated in FIG. 2, the current adjustment circuit 60 allows the feedback current bI consisting only of the DC component bId to flow through the coil 70, based on the amplified feedback voltage BV=BVd which has passed through the low-pass filter 50 and consists only of the DC component BVd.

Specifically, if the inputted amplified feedback voltage BV is zero, the current adjustment circuit 60 maintains the present feedback current bI. Conversely, if the inputted amplified feedback voltage BV is other than zero, the current adjustment circuit 60 changes the magnitude of the feedback current bI, based on the magnitude of the amplified feedback voltage BV. This adjustment controls the magnitude of the feedback current bI to precisely counteract the DC component φd of the core magnetic flux.

The DC measurement circuit 80, as illustrated in FIG. 1, includes a shunt resistor 86. The other end of the coil 70 is electrically connected to the ground side wiring Gd via this shunt resistor 86. Consequently, the feedback current bI flows through this shunt resistor 86. The voltage between the terminals of the shunt resistor 86 is the product bI×R of the feedback current bI and the electrical resistance value R of the shunt resistor 86.

As illustrated in FIG. 2, the DC measurement circuit 80 measures the voltage sV between the terminals of the shunt resistor 86. Based on this voltage sV between the terminals, the feedback current bI=bId can be calculated, and then the DC component tId of the measurement target current can be calculated. Therefore, the DC measurement circuit 80 measures the DC component tId of the measurement target current, based on the feedback current bI.

Figure 3:
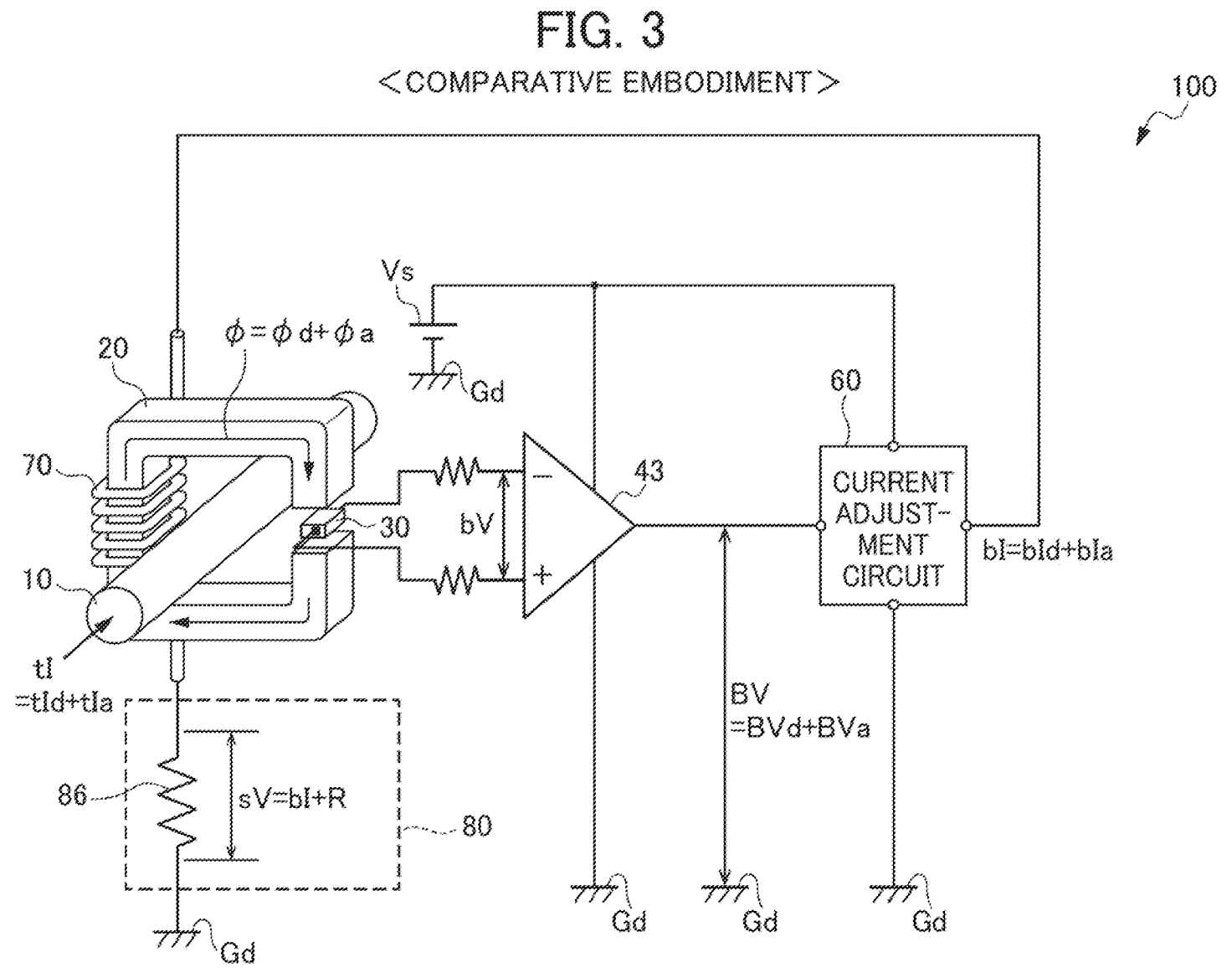

Hereinafter, the embodiment as illustrated in FIG. 3, which omits the low-pass filter 50 from the embodiment illustrated in FIG. 1, is referred to as the "Comparative Example". The effects of the present embodiment will be described below in comparison with this Comparative Example.

In the Comparative Example illustrated in FIG. 3, due to the absence of a low-pass filter, the amplified feedback voltage BV inputted into the current adjustment circuit 60 from the operational amplifier 43 includes not only the DC component BVd but also the AC component BVa. Consequently, the feedback current bI outputted by the current adjustment circuit 60 also includes both the DC component bId and the AC component bIa. The AC component bIa may cause the following problems:

Namely, as illustrated in FIG. 4, when generating the feedback current bI based on the feedback voltage bV, a response delay occurs in the current adjustment circuit 60. Thus, if the frequency of the AC component tIa included in the measurement target current tI is high, a significant phase delay occurs in the AC component bIa of the feedback current relative to the AC component tIa of the measurement target current. This characteristic can lead to adverse effects. Specifically, in the most extreme case, if this phase delay becomes half the wavelength of the AC component tIa of the measurement target current, it could amplify, rather than counteract, the AC component φa of the core magnetic flux with the AC component bIa of the feedback current.

In contrast, in the present embodiment as illustrated in FIG. 2, the low-pass filter 50 removes the AC component BVa from the amplified feedback voltage BV=BVd+BVa, leaving only the DC component BVd. Based on the amplified feedback voltage BV=BVd consisting only of the DC component BVd, the current adjustment circuit 60 allows the feedback current bI consisting only of the DC component bId to flow through the coil 70. Therefore, the feedback current bI does not include any AC component for counteracting the AC component φa of the core magnetic flux. Thus, a phase delay does not occur in the AC component of the feedback current bI relative to the AC component tIa of the measurement target current. As a result, the adverse effects caused by such phase delays can be suppressed.

Furthermore, the present embodiment can also resolve the following issues. As illustrated in FIG. 4, in the Comparative Example, the feedback voltage bV from the Hall element 30 includes both the DC component bVd and the AC component bVa, and the feedback current bI from the current adjustment circuit 60 also includes both the DC component bId and the AC component bIa. Consequently, the Comparative Example cannot efficiently separately measure the DC component tId and the AC component tIa included in the measurement target current tI.

In contrast, in the present embodiment illustrated in FIG. 2, as previously mentioned, the feedback voltage bV=bVd+bVa from the Hall element 30 consists only of the AC component bVa in the steady state. Therefore, in the steady state, the AC measurement circuit 40 can measure the AC component tIa of the measurement target current, based on the feedback voltage bV consisting only of the AC component bVa. On the other hand, the feedback current bI=bId, as mentioned earlier, always consists only of the DC component bId. Therefore, the DC measurement circuit 80 can measure the DC component tId of the measurement target current, based on the feedback current bI consisting only of the DC component bId. Thus, the present embodiment can separately measure the DC component tId and the AC component tIa included in the measurement target current tI.

Additionally, in the present embodiment, the AC measurement circuit 40 can be implemented using the operational amplifier 43. Moreover, compared to the ordinary magnetic balance type, the magnetic field inside the core is always around 0 A/m, which means that the magnetic permeability has small influence by the magnetic field dependence, thus the AC measurement circuit 60 is capable of more accurate measurements.

In other words, in the present embodiment, the operation of each component of the current measurement device 100 as illustrated in FIG. 2 is implemented as each step in the current measurement method of separately measuring the DC component tId and the AC component tIa included in the measurement target current tI. This current measurement method also achieves the same effects as the case demonstrated by the current measurement device 100.

Second Embodiment

Next, the second embodiment will be described. The present embodiment is based on the first embodiment, focusing primarily on the differences, appropriately omitting points identical or similar to those in the first embodiment.

Figure 5:
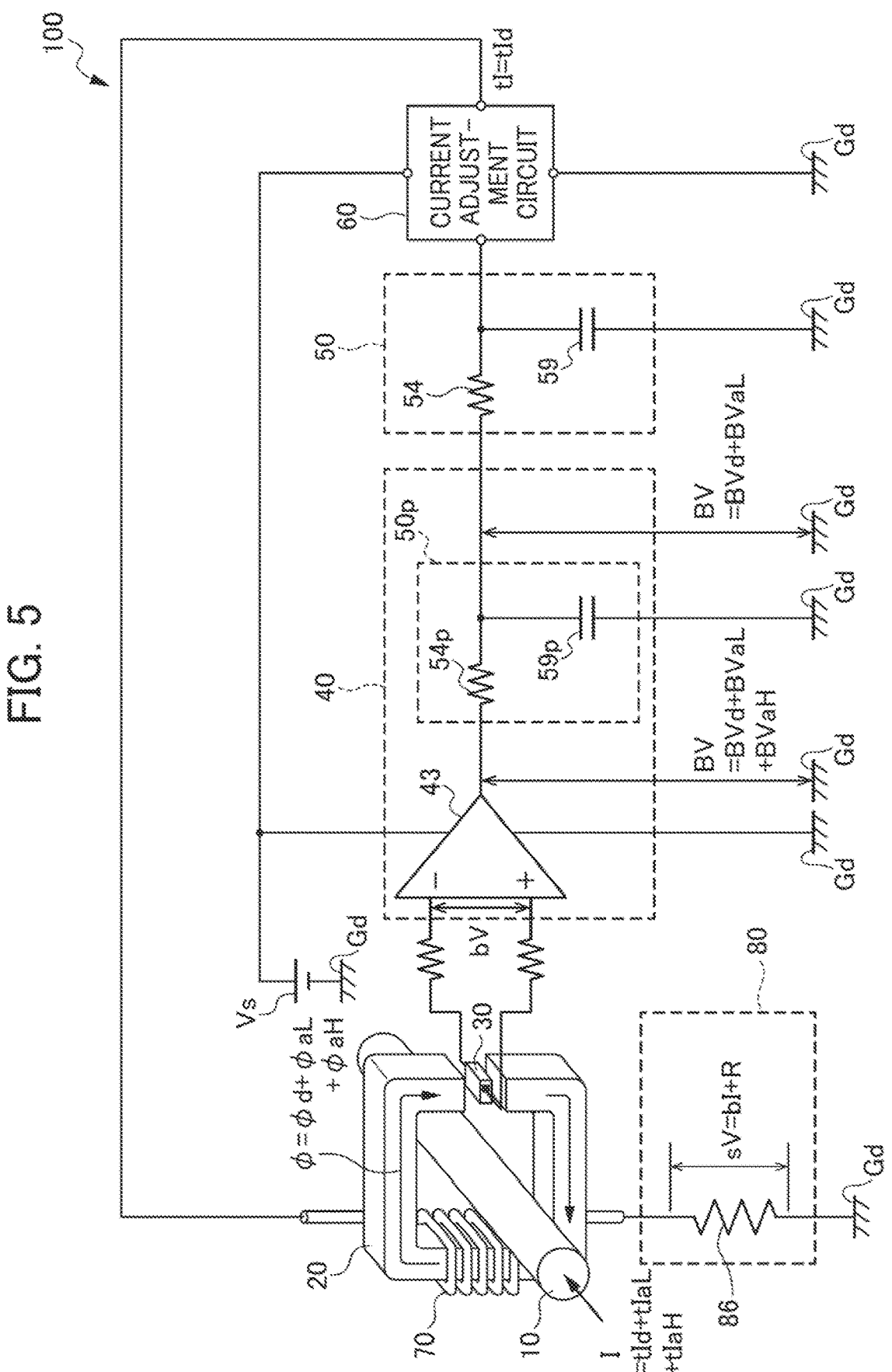
FIG. 5 is a circuit diagram illustrating a current measurement device of a second embodiment.

As illustrated in FIG. 5, the current measurement device 100 of the present embodiment further includes a preliminary low-pass filter 50p. The output terminal of the operational amplifier 43 is electrically connected to the input terminal of the current adjustment circuit 60, in sequence through the preliminary low-pass filter 50p and the low-pass filter 50.

Specifically, the preliminary low-pass filter 50p includes a preliminary electrical resistor 54p and a preliminary capacitor 59p. The output terminal of the operational amplifier 43 is electrically connected to one end of the preliminary electrical resistor 54p. The other end of the preliminary electrical resistor 54p is electrically connected to one end of the electrical resistor 54 and also electrically connected to the ground side wiring Gd through the preliminary capacitor 59p.

Therefore, the preliminary low-pass filter 50p removes the AC component equal to or above a preliminary frequency, determined by the resistance value of the preliminary electrical resistor 54p and the capacitance of the preliminary capacitor 59p. On the other hand, the low-pass filter 50 removes the AC component equal to or above a predetermined frequency, determined by the sum of the resistance values of the preliminary electrical resistor 54p and the electrical resistor 54, and the capacitance of the capacitor 59. The preliminary frequency is higher than this predetermined frequency.

Figure 6:
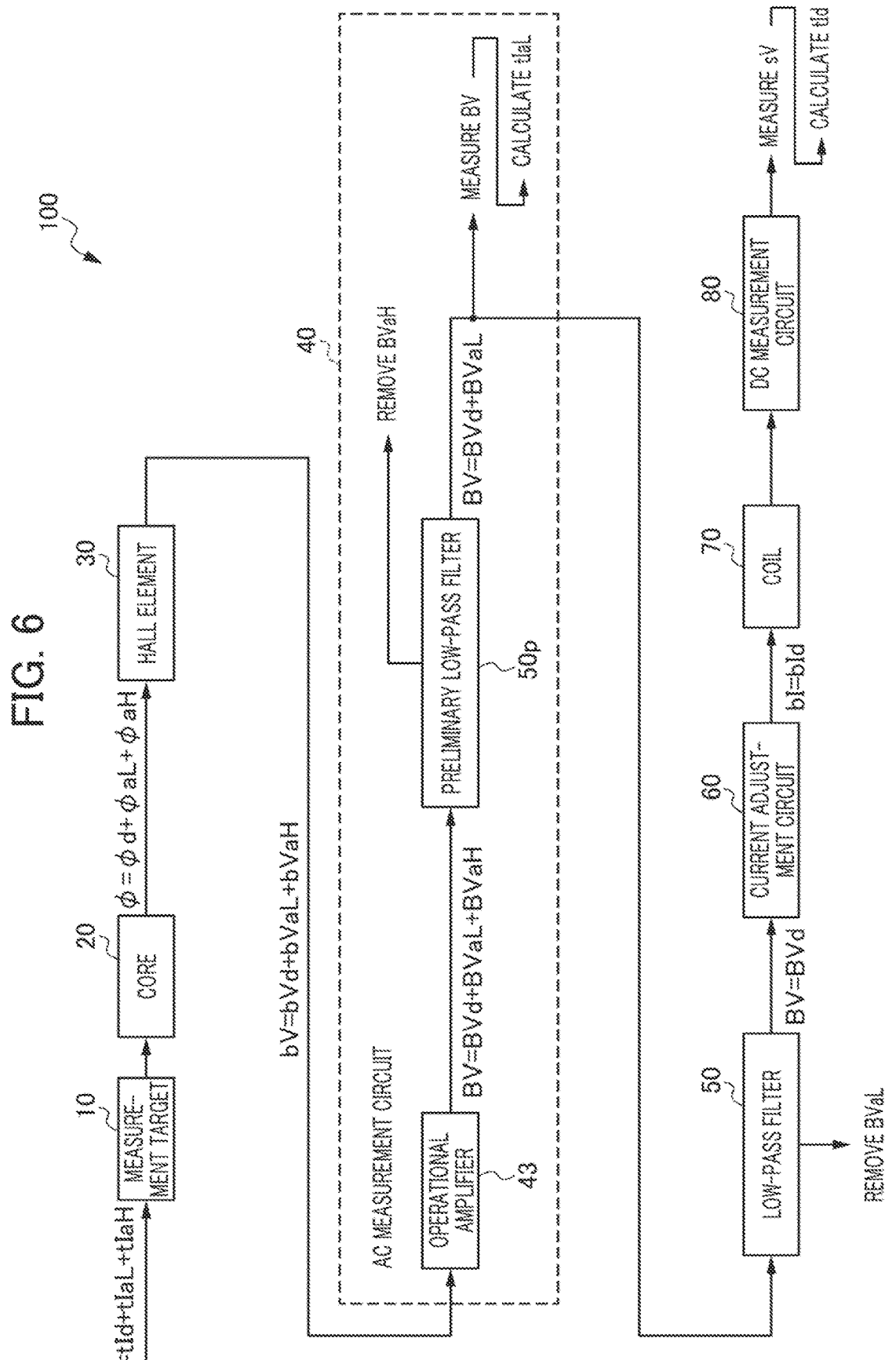
FIG. 6 is a configuration diagram illustrating the current measurement device.

The measurement target current tI includes a low-frequency component tIaL and a high-frequency component tIaH as AC components. The low-frequency component tIaL is, for example, an AC component of around 1 kHz. The high-frequency component tIaH is, for example, an AC component equal to or above 30 kHz. Consequently, the core magnetic flux $\varphi$ also includes a low-frequency component $\varphi$aL and a high-frequency component $\varphi$aH as AC components. Therefore, as illustrated in FIG. 6, the feedback voltage bV from the Hall element 30 also includes a low-frequency component bVaL and a high-frequency component bVaH as AC components. Accordingly, the amplified feedback voltage BV from the operational amplifier 43 also includes a low-frequency component BVaL and a high-frequency component BVaH as AC components.

As illustrated in FIG. 6, the preliminary low-pass filter 50p removes the high-frequency component BVaH from the amplified feedback voltage BV=BVd+BVaL+BVaH. On the other hand, the low-pass filter 50 removes the remaining low-frequency component BVaL from the amplified feedback voltage BV=BVd+BVaL, from which the high-frequency component BVaH has been removed.

As previously mentioned, in the steady state, the DC component BVd of the amplified feedback voltage is zero. Therefore, after passing through the preliminary low-pass filter 50p and before passing through the low-pass filter 50, the amplified feedback voltage BV=BVd+BVaL in the steady state consists only of the low-frequency component BVaL.

The AC measurement circuit 40, in the steady state, measures the amplified feedback voltage BV=BVaL consisting only of the low-frequency component BVaL. Based on this amplified feedback voltage BV=BVaL consisting only of the low-frequency component BVaL, the low-frequency component $\varphi$aL of the core magnetic flux can be calculated, and subsequently the low-frequency component tIaL of the measurement target current can be calculated. However, it should be noted that part of the low-frequency component BVaL of the amplified feedback voltage is removed by the preliminary resistance value 54p, and this needs to be taken into account. Consequently, the AC measurement circuit 40 measures the low-frequency component tIaL of the measurement target current, based on the amplified feedback voltage BV, from which the high-frequency component BVaH has been removed.

As such, according to the present embodiment, the measurement range for the AC components tIaL, tIaH included in the measurement target current tI can be narrowed down to a range equal to or below the preliminary frequency and equal to or above the predetermined frequency. Thus, the AC measurement circuit 40 can measure only the low-frequency component tIaL of the measurement target current.

Other Embodiments

The above-described embodiments can be carried out through modification, for example, in the following manners. The AC measurement circuit 40 as illustrated in FIG. 1 may measure the voltage between the terminals of the electrical resistor 54 of the low-pass filter 50, instead of output voltage of the operational amplifier 43. In this case, the AC measurement circuit 40 measures the AC component BVa of the amplified feedback voltage BV, which is the component to be removed. This mode also allows for measuring the AC component tIa of the measurement target current.

Moreover, in the second embodiment illustrated in FIG. 5, the AC measurement circuit 40 may further measure the voltage between the terminals of the preliminary electrical resistor 54*p*. In this case, the AC measurement circuit 40 further measures the high-frequency component BVaH of the amplified feedback voltage BV, which is the component to be removed by the preliminary low-pass filter 50*p*. However, it should be noted that part of the low-frequency component BVaL is also removed by the preliminary resistance value 54*p*, and this needs to be taken into account. This mode allows for separately measuring the high-frequency component tIaH and the low-frequency component tIaL included in the measurement target current.

EXPLANATION OF REFERENCE NUMERALS

10: measurement target
20: core
30: Hall element (element)
40: AC measurement circuit
50: low-pass filter
60: current adjustment circuit
70: coil
80: DC measurement circuit
100: current measurement device
tI: measurement target current
tId: DC component of measurement target current
tIa: AC component of measurement target current
bV: feedback voltage
bVa: AC component of feedback voltage
BV: amplified feedback voltage (amplified feedback voltage)
BVa: AC component of amplified feedback voltage
BVaL: low-frequency component of amplified feedback voltage
BVaH: high-frequency component of amplified feedback voltage
bI: feedback current

What is claimed is:

1. A current measurement device that measures a measurement target current that is a current flowing through a measurement target, the device comprising:
   a core through which magnetic flux flows due to the measurement target current;
   a coil externally fitted around the core and not electrically connected to the measurement target;
   an element that generates a feedback voltage, based on core magnetic flux that is a magnetic flux flowing along the core;
   an AC measurement circuit that measures an AC component of the measurement target current, based on the feedback voltage;
   a low-pass filter that removes an AC component equal to or above a predetermined frequency from the feedback voltage,
   a current adjustment circuit that allows a feedback current to flow through the coil, based on the feedback voltage, from which the AC component has been removed, to counteract a DC component of the core magnetic flux; and
   a DC measurement circuit that measures a DC component of the measurement target current, based on the feedback current.

2. The current measurement device according to claim 1, wherein
   the AC measurement circuit includes an operational amplifier that amplifies the feedback voltage generated by the element, and
   the AC measurement circuit measures an AC component of the measurement target current, based on the feedback voltage amplified.

3. The current measurement device according to claim 1, further comprising:
   a preliminary low-pass filter that removes an AC component equal to or above a preliminary frequency that is higher than the predetermined frequency from the feedback voltage, before the low-pass filter removes an AC component equal to or above the predetermined frequency from the feedback voltage, and
   the AC measurement circuit measures an AC component of the measurement target current, based on the feedback voltage from which the AC component equal to or above the preliminary frequency has been removed.

4. A current measurement method of measuring a measurement target current by using:
   a core through which magnetic flux flows due to the measurement target that is a current flowing through a measurement target;
   a coil externally fitted around the core and not electrically connected to the measurement target; and
   an element that generates a feedback voltage, based on core magnetic flux that is a magnetic flux flowing along the core;
   the method comprising the steps of:
   measuring an AC component of the measurement target current, based on the feedback voltage;
   removing an AC component equal to or above a predetermined frequency from the feedback voltage using a low-pass filter;
   allowing a feedback current to flow through the coil, based on the feedback voltage, from which the AC component has been removed, to counteract a DC component of the core magnetic flux; and
   measuring a DC component of the measurement target current, based on the feedback current.

5. A current measurement device that measures a measurement target current that is a current flowing through a measurement target, the device comprising:
   a core through which magnetic flux flows due to the measurement target current;
   a coil externally fitted around the core;
   an element that generates a feedback voltage, based on core magnetic flux that is a magnetic flux flowing along the core;
   an AC measurement circuit that measures an AC component of the measurement target current, based on the feedback voltage;
   a low-pass filter that removes an AC component equal to or above a predetermined frequency from the feedback voltage,
   a current adjustment circuit that allows a feedback current to flow through the coil, based on the feedback voltage, from which the AC component has been removed, to counteract a DC component of the core magnetic flux; and
   a DC measurement circuit that measures a DC component of the measurement target current, based on the feedback current,
   the device further comprising:

a preliminary low-pass filter that removes an AC compo-
nent equal to or above a preliminary frequency that is
higher than the predetermined frequency from the
feedback voltage, before the low-pass filter removes an
AC component equal to or above the predetermined
frequency from the feedback voltage, and
the AC measurement circuit measures an AC component
of the measurement target current, based on the feed-
back voltage from which the AC component equal to or
above the preliminary frequency has been removed.

* * * * *